(12) United States Patent
Sasaki

(10) Patent No.: US 8,611,159 B1
(45) Date of Patent: Dec. 17, 2013

(54) MEMORY WRITE INTERFACE IN AN INTEGRATED CIRCUIT AND METHOD OF PROVIDING SAME

(75) Inventor: Paul T. Sasaki, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 389 days.

(21) Appl. No.: 12/949,125

(22) Filed: Nov. 18, 2010

(51) Int. Cl.
*G11C 7/00* (2006.01)

(52) U.S. Cl.
USPC .................. 365/189.02; 365/189.08; 365/194

(58) Field of Classification Search
USPC .......... 365/189.02, 194, 189.08, 191, 230.03, 365/233, 185.18, 51, 63, 227, 185.11, 365/230.05
See application file for complete search history.

(56) References Cited

U.S. PATENT DOCUMENTS 7,138,829 B1 * 11/2006 Dalvi .............................. 326/41
8,134,878 B1 * 3/2012 Shimanek et al. ............ 365/194

OTHER PUBLICATIONS

Virtex-6 FPGA SelectIO Resources, UG361 (v1.0) Jun. 24, 2009, pp. 1-160, Xilinx, Inc., San Jose, California US.
Virtex-6 FPGA Memory Interface Solutions, UG406 (v1.0) Jun. 24, 2009, pp. 1-130, Xilinx, Inc., San Jose, California US.

* cited by examiner

*Primary Examiner* — Harry W Byrne
(74) *Attorney, Agent, or Firm* — Robert M. Brush

(57) ABSTRACT

A memory write interface in an integrated circuit (IC) and method of providing the same are described. An aspect relates to an apparatus for providing an input/output (IO) interface in a programmable device. The apparatus can include: a memory write interface configured to drive a memory having a daisy-chained clock, a first interface configured to receive output data from the programmable device and a second interface configured to control transmission of the output data to the memory by an IO element of the programmable device, the first interface operating according to a global clock of the programmable device and the second interface operating according to a local clock used only by the IO interface; a delay circuit configured to add a delay to the local clock with respect to the global clock; and a configuration circuit configured to adjust the delay added to the local clock to implement write-leveling at the memory.

20 Claims, 8 Drawing Sheets

MEMORY WRITE INTERFACE IN AN INTEGRATED CIRCUIT AND METHOD OF PROVIDING SAME

FIELD OF THE INVENTION

One or more aspects of the present invention relate generally to integrated circuits and, more particularly, to a memory write interface in an integrated circuit (IC) and method of providing the same.

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost. An FPGA typically includes an array of configurable logic blocks (CLBs), programmable input/output blocks (IOBs), and like type programmable elements. The CLBs and IOBs are interconnected by a programmable interconnect structure. The programmable resources such as, e.g., programmable logic of an FPGA (e.g., CLBs, IOBs, and interconnect structure) is typically programmed by loading a stream of configuration data (known as a bitstream) into internal configuration memory cells.

ICs, such as FPGAs, can include input/output (IO) circuitry capable of meeting the specifications of particular memory circuits. One type of dynamic random access memory (DRAM) used in today's high-bandwidth applications is double data rate 3 (DDR3) memory as defined by the Joint Electron Devices Engineering Council (JEDEC). IO circuitry that writes to DDR3 memory is required to meet two specific specifications: (1) the output signals must have low jitter; and (2) the data must be able to be delayed with respect to the clock by more than 1 ns to implement a "write leveling" technique. DDR3 memory includes memory components with a daisy-chained clock. Such topology of memory chips on a DDR3 memory module results in a skew delay between the clock and the data. A technique known as "write leveling" must be employed to compensate for this skew delay.

Programmable ICs, such as an FPGA, can include a global clock that is distributed throughout the programmable fabric. The global clock can be used to clock the IO circuitry driving DDR3 memory, as well as providing a clock for use by the DDR3 memory. Because of the multitude of outputs and fabric switching on an FPGA, the global clock lines can include a substantial amount of noise. Experimental data has shown that global clock jitter in a typical FPGA can exceed 100 ps. DDR3 memories presently can have a data rate of 1600 megabits per second (Mbps). The DDR3 specification requires that the period jitter cannot exceed 140 ps. If the global clock jitter is over 100 ps, a specification of 140 ps would be difficult if not impossible to meet.

Further, on a memory module of DDR3 chips (e.g., a dual inline memory module (DIMM)), the delay from the first memory chip to the last memory chip can exceed 1.2 ns. One technique to implement the necessary write leveling is to use a delay line to delay the data with respect to the clock. One problem with this approach, however, is that every tap used in the delay line will add a finite amount of deterministic jitter to the data. With a 1600 Mbps bandwidth, the data eye is 625 ps wide. A 1.2 ns delay of the data through a delay line to implement write leveling, for example, could add 70 to 80 ps of deterministic jitter to the data. In such an example, almost ⅓ of the output eye would be lost before including any losses due to the IO circuitry, the package, and the medium.

Accordingly, there exists a need in the art for a memory write interface in an IC that overcomes the aforementioned disadvantages.

SUMMARY OF THE INVENTION

An aspect of the invention relates to an apparatus for providing an input/output (IO) interface in a programmable device. The apparatus can include: a memory write interface configured to drive a memory having a daisy-chained clock, the first interface configured to receive output data from the programmable device and a second interface configured to control transmission of the output data to the memory by an IO element of the programmable device, the first interface operating according to a global clock of the programmable device and the second interface operating according to a local clock used only by the IO interface; a delay circuit configured to add a delay to the local clock with respect to the global clock; and a configuration circuit configured to adjust the delay added to the local clock to implement write-leveling at the memory.

In some embodiments, the FIFO system can include a plurality of FIFO circuits, each receiving one of the inputs of the FIFO system and providing one of the outputs of the FIFO system. The FIFO system can include an address circuit configured to generate an address signal for the plurality of FIFO circuits for storing and outputting the output data. Each of the plurality of FIFO circuits can include: a plurality of flip-flops configured to receive the output data operative using the global clock; a write decoder configured to selectively enable one or more of the plurality of flip-flops; a first multiplexer configured to select output from one of the plurality of flip-flops based on a first control signal; and a read decoder configured to generate the first control signal. Each of the plurality of FIFO circuits can further include: first and second flip-flops coupled in series, the first and second flip-flops configured to store output of the first multiplexer according to the local clock; a second multiplexer configured to select the output of the first multiplexer, output of the first flip-flop, or output of the second flip-flop based on a second control signal; wherein the address circuit is configured to generate the second control signal. Each of the plurality of FIFO circuits can further include a third flip-flop configured to store output of the second multiplexer according to the local clock.

The address circuit can include: a write address generator configured to generate write address data for storing the output data in the plurality of FIFO circuits according to the global clock; latch circuits configured to store the write address data; a read address generator configured to generate read address data for reading the output data from the plurality of FIFO circuits according to the local clock; and a phase compare circuit, configured to receive the write address data from the latch circuits and the read address data from the read address generator, the phase compare circuit configured to determine skew between the global clock and the local clock and generate the second control signal based on the skew. The FIFO system can further include a delay control circuit configured to control the delay circuit to receive the local clock as input. Each of the plurality of FIFO circuits can further include a reset circuit configured to reset each of the plurality of FIFO circuits and the address circuit. The IO element can include a three-state output driver, and the output data can include control data for controlling the three-state output driver.

Another aspect of the invention relates to a method of interfacing a programmable device and a memory, the memory having a daisy-chained clock. The method can include: receiving output data from resources in the programmable device at an input/output (IO) interface according to a global clock of the programmable device; providing the output data for transmission to the memory from an UI element of the programmable device according to a local clock used only by the IO interface; adding a delay to the local clock with respect to the global clock; and adjusting the delay to implement write-leveling at the memory.

In some embodiments, the IO element can include a three-state output driver, and the output data can include control data for controlling the three-state output driver. The output data can be received at a single data rate (SDR) and the output data can be provided at a SDR or a double data rate (DDR). The step of receiving the output data can include storing the output data in a first-in-first-out (FIFO) system according to the global clock. The step of providing can include reading the output data from the FIFO system according to the local clock. The method can further include: determining a skew between the global clock and the local clock; and delaying the output data in the FIFO system based on the skew. The step of delaying the output data can include: passing the output data through one or more flip-flops before being read from the FIFO system based on the skew. The step of adjusting the delay can include: programming configuration memory of the programmable device such that a delay circuit that delays the local clock is configured with the delay.

An aspect of the invention relates to a programmable device coupled to a memory having a daisy-chained clock. The programmable device can include: configured resources for generating output data to be transmitted to the memory; input/output (IO) elements for coupling the output data to the memory; and an IO interface between the configured resources and the IO elements, the IO interface including a memory write interface for driving the memory. The memory write interface can include: a first-in-first-out (FIFO) system having inputs for receiving the output data using a global clock of the programmable device and outputs for providing the output data using a local clock, the local clock being used only by IO interface; delay circuitry configured to add delay to the local clock with respect to the global clock; and a configuration circuit configured to adjust the delay added to the local clock to implement write-leveling.

In some embodiments, the FIFO system can include: a plurality of FIFO circuits, each receiving one of the inputs of the FIFO system and providing one of the outputs of the FIFO system; and an address circuit configured to generate an address signal for the plurality of FIFO circuits for storing and outputting the output data. Each of the plurality of FIFO circuits can include: a plurality of flip-flops configured to receive the output data operative using the global clock; a write decoder configured to selectively enable one or more of the plurality of flip-flops; a first multiplexer configured to select output from one of the plurality of flip-flops based on a first control signal; a read decoder configured to generate the first control signal; first and second flip-flops coupled in series, the first and second flip-flops configured to store output of the first multiplexer according to the local clock; and a second multiplexer configured to select the output of the first multiplexer, output of the first flip-flop, or output of the second flip-flop based on a second control signal; wherein the address circuit is configured to generate the second control signal.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

A memory write interface in an integrated circuit (IC) and method of providing the same is described. One or more embodiments of the invention relate to providing a memory write interface in a programmable IC that provides a low jitter of clock and data. Although specific reference is made to field programmable gate arrays (FPGAs), some or all of the various aspects of the invention may be used in other types of programmable ICs, such as complex programmable logic devices (CPLDs) and the like. Further, it can be understood from the description below that some aspects of the memory write interface can be used in ICs in general.

In some embodiments, multiple techniques are used to produce low jitter outputs that can be delayed for use in clocking DDR3 memory systems and like type memory systems. A low jitter output can use a clock that only goes to input/output (I/O) circuitry, rather than a global clock. Write leveling can be implemented by delaying the clock through a delay line. Since a clock pattern only generates random jitter and no deterministic jitter, only minimal jitter is added. A buffer can be used to cross between the "noisy" global clock domain and the "clean" output clock domain.

Figure 1:
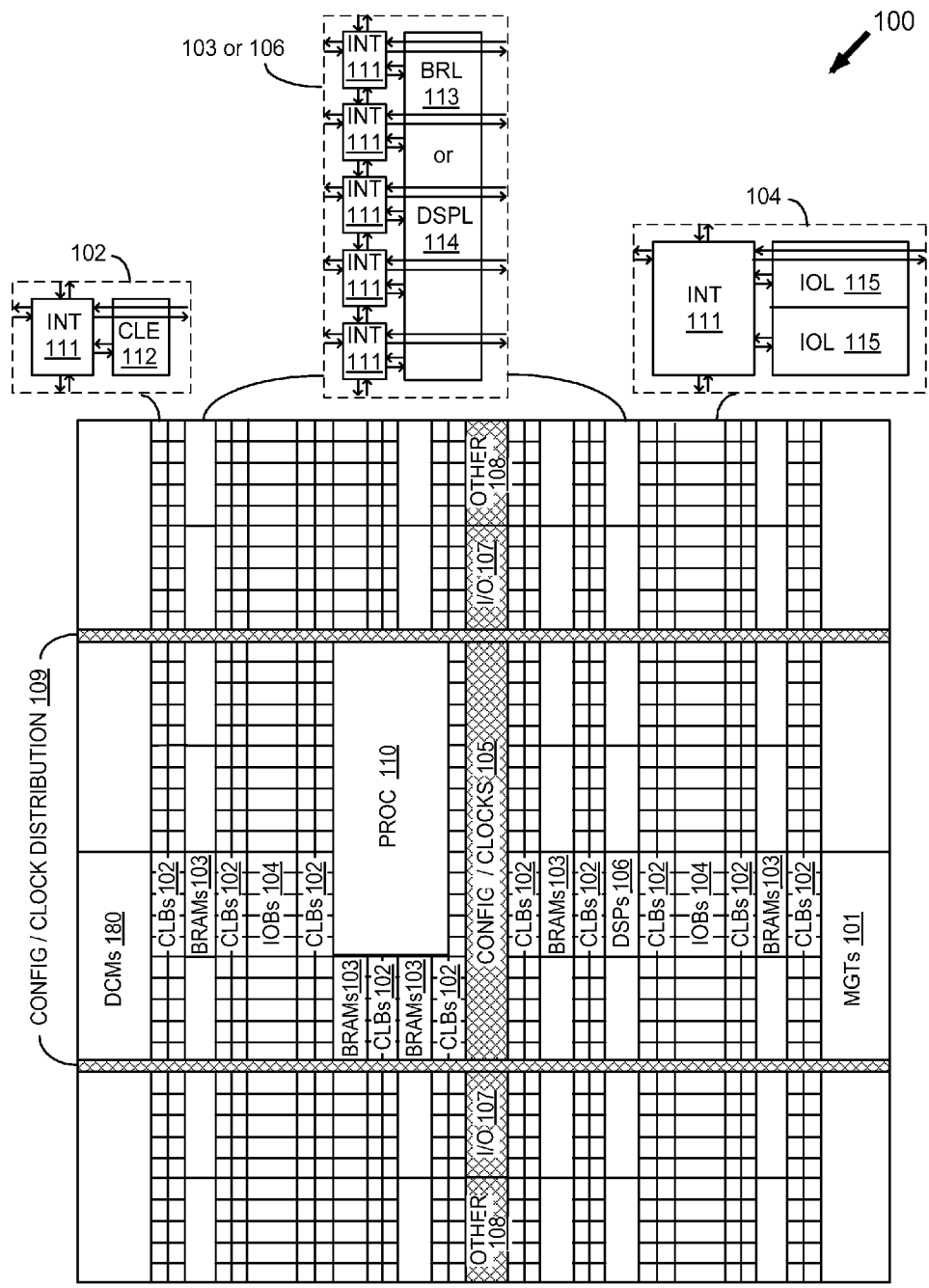
FIG. 1 illustrates an exemplary architecture for a programmable logic plane of an FPGA.

FIG. 1 illustrates an exemplary architecture for a programmable logic plane 100 of an FPGA. The architecture 100 includes a large number of different programmable tiles including multi-gigabit transceivers (MGTs) 101, configurable logic blocks (CLBs) 102, random access memory blocks (BRAMs) 103, input/output blocks (IOBs) 104, configuration and clock logic 105, digital signal processing blocks (DSPs) 106, specialized input/output blocks (I/O) 107 (e.g., configuration ports and clock ports), and other programmable blocks 108, such as digital clock managers, analog-to-digital converters, system monitoring logic, and so forth. The FPGA 100 can further include an IO circuit 200, as described below. The IO circuit 200 can be included in each of the IOLs 115. The layout of the physical structures implementing the programmable logic plane 100 on the IC may be the same or similar to the layout of the logical architecture shown in FIG. 1.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element (INT) 111 also includes the connections to and from the programmable logic element within the same tile, as shown by the examples included at the top of FIG. 1. The programmable tiles and corresponding programmable interconnect structure are generally referred to as "programmable logic."

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 are manufactured using metal layered above the various illustrated logic blocks, and typically are not confined to the area of the input/output logic element 115.

The FPGA architecture 100 may also include one or more dedicated processor blocks (PROC) 110. The processor block 110 comprises a microprocessor core, as well as associated control logic. The processor block 110 is coupled to the programmable logic of the FPGA in a well known manner.

In the pictured embodiment, a columnar area near the center of the die (shown hatched in FIG. 1) is used for the configuration and clock logic 105, the I/O logic 107, and the other control logic 108. Horizontal areas 109 extending from this column are used to distribute global clocks and configuration signals across the breadth of the FPGA. The configuration logic provides an interface to, and loads configuration data to, a configuration memory (not shown).

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations as well as the location of the blocks within the array included at the top of FIG. 1 are purely exemplary. For example, in an actual FPGA more than one adjacent column of CLBs is typically included wherever the CLBs appear, to facilitate the efficient implementation of user logic.

Figure 2:
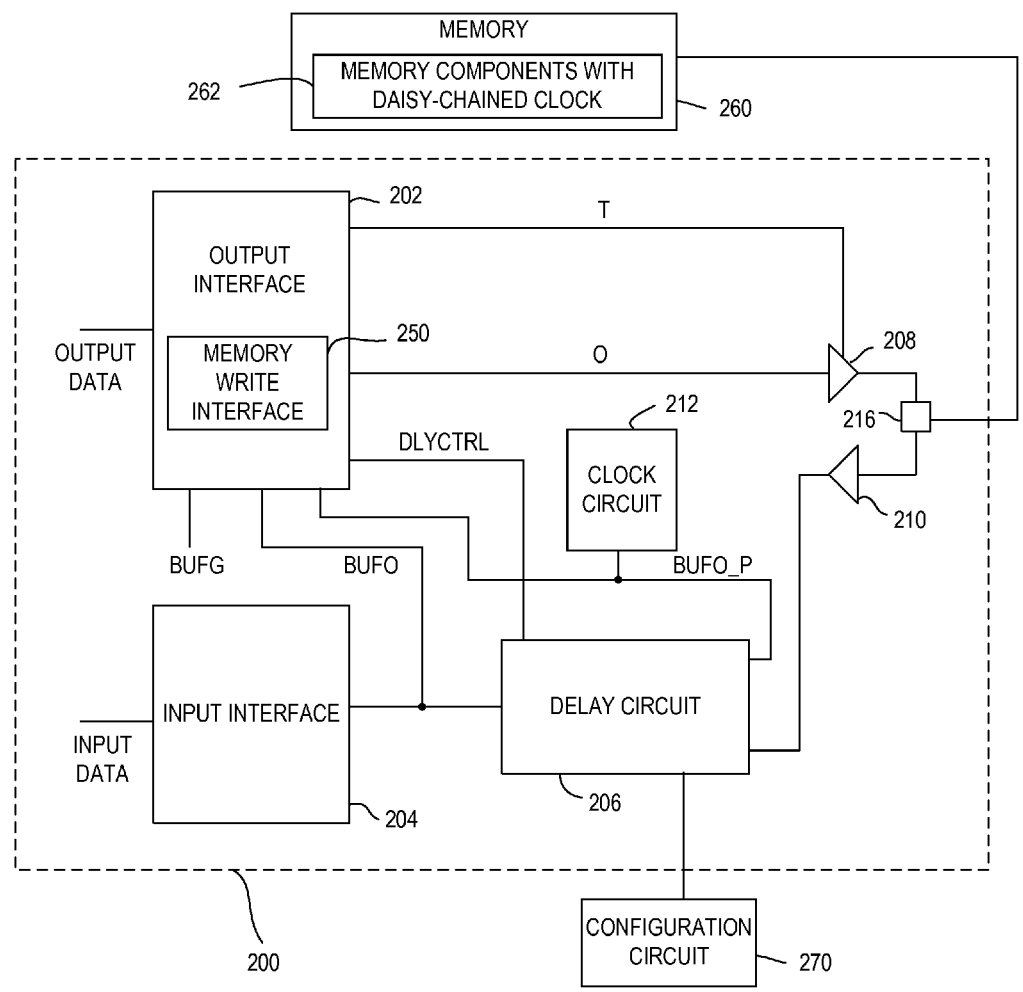
FIG. 2 is a block diagram depicting an embodiment of input/output (IO) circuit.

FIG. 2 is a block diagram depicting an embodiment of input/output (IO) circuit 200. In the FPGA 100, the IO circuit 200 can be included in one or more of the IOBs 104, and more specifically, can be included in each of the IOLs 115. The IO circuit 200 can be coupled to a memory 260. The memory 260 includes a plurality of memory components 262 having a daisy-chained clock. For example, the memory 260 can be compliant with the DDR3 standard as defined by the Joint Electron Devices Engineering Council (JEDEC) and as is known in the art. For purposes of clarity by example, the IO circuit 200 is shown as driving a single input, output, or input/output of the memory 260. It is to be understood that a plurality of the IO circuit 200 can be used to interface with a memory having a plurality of input, output, and input/output terminals.

The IO circuit 200 includes an output interface 202, an input interface 204, a delay circuit 206, an output driver 208, an input driver 210, and a clock circuit 212. The output driver 208 and the input driver 210 collectively comprise an IO element. The output interface 202 is configured to receive data to be transmitted from the IO circuit 200 (provided as output of the IO circuit 200 and referred to as "output data"). The output interface 202 includes a first clock input configured to receive a global clock signal (BUFG), a second clock input configured to receive a clock signal from the clock circuit 212 (referred to herein as the "clean clock" and designated BUFO_P), and a third clock input coupled to an output of the delay circuit 206 (BUFO). The clean clock can also be referred to herein as a "local clock" to distinguish from the global clock. The clock signal BUFG can be produced by the clock circuit in the FPGA 100. The clock signal produced by the clock circuit 212 can be dedicated to the IO circuit 200 and thus can be less noisy than the global clock signal (i.e., has less jitter). Internally, the IO circuit 200 uses the clean clock from the clock circuit 212 (or a delayed version of the clean clock, as described below). Thus, the output interface 202 provides an interface between circuitry employing the global clock (i.e., configured login in the FPGA 100 that produces the data to be output) and circuitry in the IO circuit 200 employing the clean clock. It is to be understood that, in some embodiments, the clock circuit 212 can be external to the IO circuit 200. The clock circuit 212 can be used to provide a clean clock to multiple instances of the IO circuit 200 in the FPGA 100.

The output interface 202 includes outputs T and O coupled to respective inputs of the output driver 208. The output interface 202 further includes an output DLYCTRL coupled to the delay circuit 206. An output of the delay circuit 206 (BUFO) is coupled to both the third clock input of the output interface 202 and an input of the input interface 204. An output of the output driver 208 is coupled to a pad 216 (e.g., an external contact of the FPGA 100). An input of the input driver 210 is coupled to the pad 216 (i.e., the pad 216 is an IO pad). An output of the input driver 210 is coupled to an input of the delay circuit 206. Alternatively, the output of the input driver 210 can bypass the delay circuit 206 and be sent directly to the input of the input interface 204. The delay circuit 206 is also configured to receive the clock signal BUFO_P from the clock circuit 212. The input interface 204 is configured to provide data received from the IO circuit 200 as output (referred to as "input data").

The output interface 202 includes a memory write interface 250. As described in detail below, the memory write interface 250 can produce signals for writing to DDR3 memory or like type double-data rate memory. In operation, the output data received by the output interface 202 comprises data and control signals for transmitting a signal to the memory. The memory write interface 250 processes the write and control data and produces the output signals T, O, and DLYCTRL The control signal T is used as a three-state control signal.

Notably, the output driver 208 can be a three-state driver capable of outputting logic high, logic low, and high impedance states. The output driver 208 can be placed in the high impedance state when the input driver 210 is to be used to receive data (since the output driver 208 and the input driver 210 are coupled to the same physical pad 216). The data signal O comprises the signal to be transmitted to the memory. The control signal DLYCTRL is configured to cause the delay circuit 206 to process either BUFO_P or the output of the input driver 210.

In particular, when transmitting a signal to the memory, the output driver 208 is enabled and the delay circuit 206 can be configured to delay the clock signal BUFO_P. When reading data from the memory, the output driver 208 is disabled (placed in high-impedance mode) and the delay circuit 206 can be configured to delay the input data from the input driver 210. In transmit mode, the delay circuit 206 provides a delayed version of the clock signal BUFO_P (referred to as BUFO) to the output interface 202 for use by the memory write interface 250. The delayed clock BUFO can be used to implement a write-leveling process when transmitting a signal to the memory. Thus, in some embodiments, write-leveling can be implemented by delaying the clock IO clock signal BUFO_P, rather than by delaying the data (O) being transmitted to the memory. In some embodiments, the delay circuit 206 is coupled to a configuration circuit 270 that determines the delay to be added to the clean clock to implement write-leveling. Alternatively, the delay circuit 206 can be controlled by the user; for example, the delay circuit 206 can include circuits that allow dynamic user control of the delay by building control circuits using the CLBs 102 and sending control information to the delay circuit 206 using the interconnect 111. The configuration circuit 270 can be a dedicated circuit for determining the delay to be added (as well as delay for other instances of the circuit 200). Alternatively, the configuration circuit 270 can be part of the configuration logic in the FPGA 100 (e.g., the delay in the delay circuit 206 can be set by storing particular value(s) in the configuration memory of the FPGA 100 during configuration).

Figure 3:
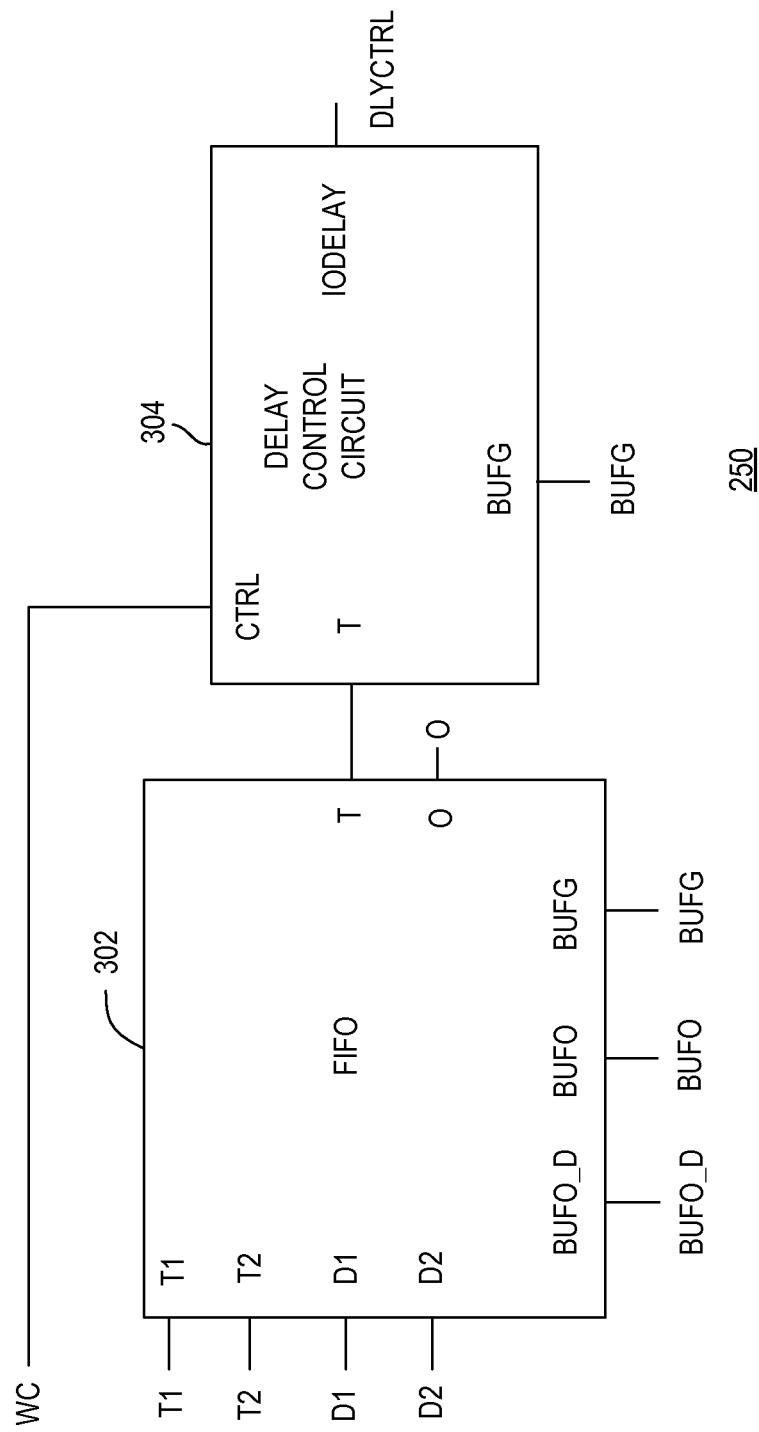
FIG. 3 is a block diagram depicting an embodiment of a memory write interface.

FIG. 3 is a block diagram depicting an embodiment of the memory write interface 250. The memory write interface 250 can include a first-in-first-out (FIFO) system 302 and a delay control circuit 304. The FIFO system 302 includes inputs T1, T2, D1, and D2, which are a portion of the output data received by the output interface 202. Since the output data can be double data rate (DDR), the can be two signals for each of the control output T (T1 and T2) and the data output O (D1 and D2). The FIFO system 302 also includes a clock input BUFO_D configured to receive the clock signal BUFO_D, a clock input BUFO configured to receive the clock signal BUFO, and a clock input BUFG configured to receive the clock signal BUFG. The FIFO system 302 includes outputs T and O for providing the control signal T and the output signal O, respectively.

The delay control circuit 304 includes an input T for receiving the control signal T, a clock input BUFG for receiving the clock signal BUFG, and an input CTRL for receiving write control (WC) data. The WC data can be part of the output data received by the output interface 202. The delay control circuit 304 includes an output IODELAY that provides the control signal DLYCTRL to the delay circuit 206.

In operation, the FIFO system 302 multiplexes the input signals T1 and T2 on the output signal T, and multiplexes the input signals D1 and D2 on the output signal O. The input signals T1, T2, D1, and D2 are timed with respect to the global clock signal BUFG and can be produced by configured logic in the FPGA 100. The signals T and O output by the FIFO system 302 are timed with respect to the clean clock BUFO (or a delayed version of the clean clock BUFO_D). Thus, the FIFO system 302 provides an interface across clock domains between the global clock and the clean clock. The delay control circuit 304 controls whether the delay circuit 206 is configured to delay the clean clock BUFO (for write-leveling) or the input data from the input driver 210 (needed when reading from the memory). Whether the delay control circuit 304 invokes the transmit or receive mode depends on the control data WC provided as part of the output data received by the output interface 202.

The delay control circuit 304 is only needed if the delay circuit 206 is used for both transmission and receiving modes. If the delay circuit 206 is only used in the transmit mode to delay the clean clock, then the delay control circuit 304 can be omitted.

Figure 4:
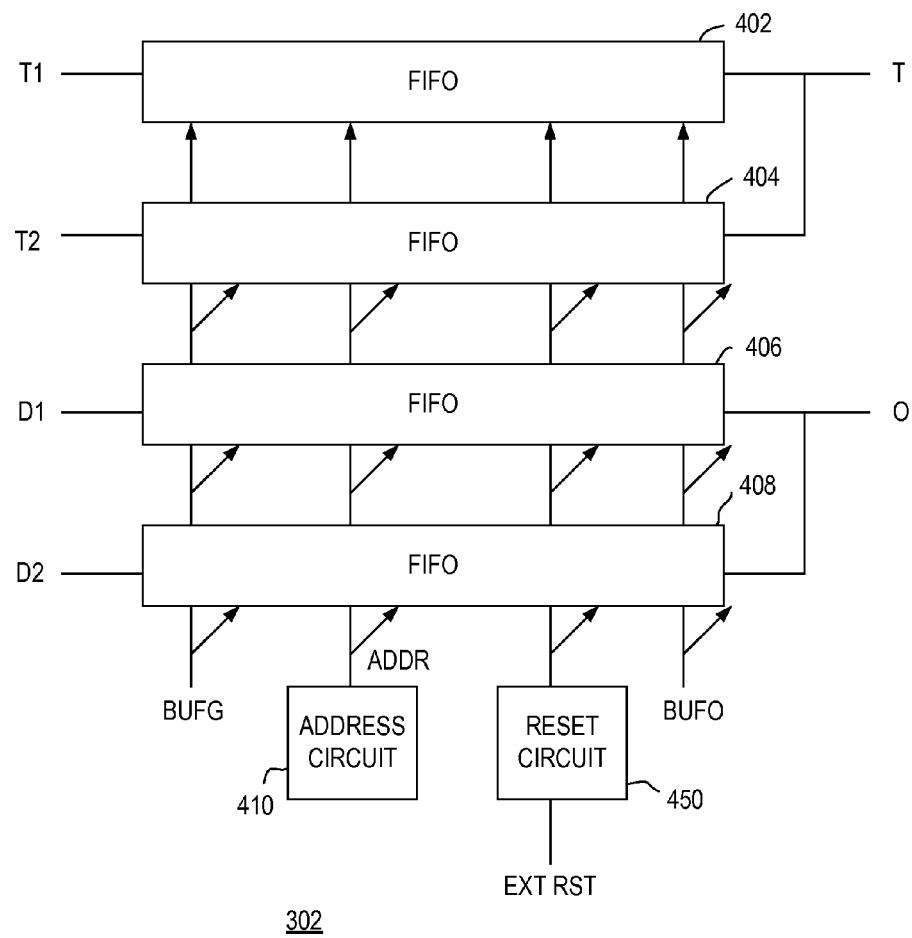
FIG. 4 is a block diagram depicting an embodiment of a FIFO system.

FIG. 4 is a block diagram depicting an embodiment of the FIFO system 302. The FIFO system 302 can include FIFO circuits 402 through 408 and an address circuit 410. An input of the FIFO 402 receives the input signal T1, and an output of the FIFO 402 is coupled to an output 412 that provides the control signal T. An input of the FIFO 404 receives the input signal T2, and an output of the FIFO 404 is coupled to the output 412. An input of the FIFO 406 receives the input signal D1, and an output of the FIFO 406 is coupled to an output 414 that provides the output signal O. An input of the FIFO 408 receives the input signal D2, and an output of the FIFO 408 is coupled to the output 414. Each of the FIFOs 402 through 408 includes a clock port configured to receive the global clock BUFG, and a clock port configured to receive the clean clock BUFO. Each of the FIFOs 402 through 408 further includes an input coupled to an output (ADDR) of the address circuit 410. The address circuit 410 is configured to provide address signals to the FIFOs 402 through 408.

In operation, the signals T1 and T2 are clocked into the FIFOs 402 and 404 using the global clock BUFG. The control signal T is a DDR signal comprising a multiplex of T1 and T2 clocked at the clean clock BUFO. The address circuit 410 generates addresses for the FIFOs 402 and 404 to implement the multiplexing of T1 and T2 on the control signal T. Likewise, the signals D1 and D2 are clocked into the FIFOs 406 and 408 using the global clock BUFG. The data signal O is a DDR signal comprising a multiplex of D1 and D2 clocked at the clean clock BUFO. The address circuit 410 generates addresses for the FIFOs 406 and 408 to implement the multiplexing of D1 and D2 on the data signal O.

In some embodiments, the FIFO system 302 can include a reset circuit 450. The reset circuit 450 can be coupled to reset inputs of each of the FIFOs 402 through 408 and the address circuit 410. The reset circuit 450 can receive a reset signal as external input. Based on the input reset signal, the reset circuit 450 can reset the FIFOs 402 through 408 and the address generator 410 (e.g., the FIFOs are emptied of data and the addresses are initialized). The reset circuit 450 can include various combinatorial and/or synchronous logic operative using the global clock and the clean clock. In embodiments where the delay circuit 206 shown in FIG. 2 is shared between transmission and reception, the reset circuit 450 can reset the FIFO system 302 upon a transition from the receive mode to the transmit mode at the delay circuit 206.

Figure 5:
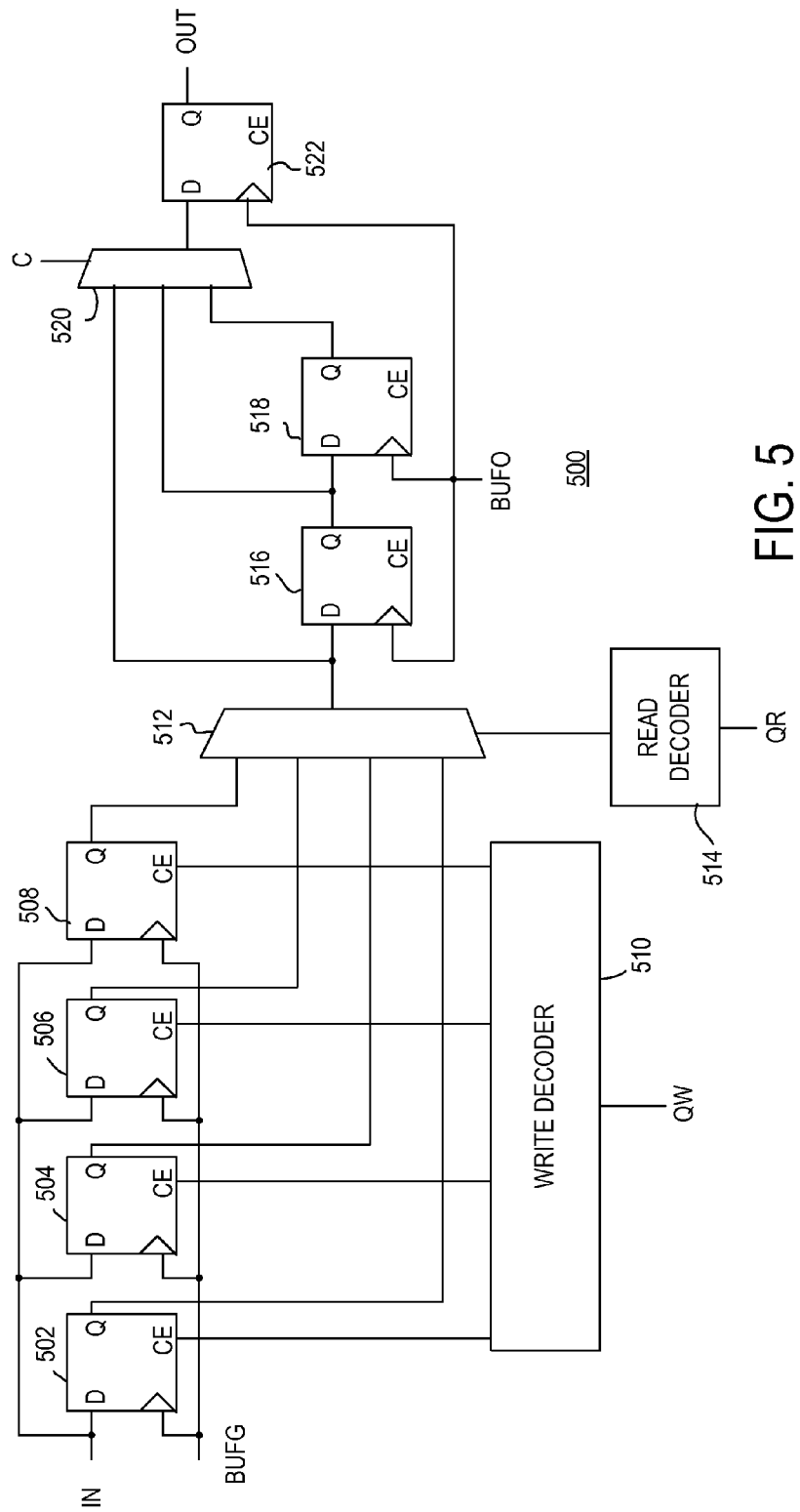
FIG. 5 is a block diagram depicting an embodiment of a FIFO circuit.

FIG. 5 is a block diagram depicting an embodiment of a FIFO circuit 500. Each of the FIFOs 402 through 408 shown in FIG. 4 can be implemented using a FIFO circuit 500 shown in FIG. 5. The FIFO circuit 500 includes flip-flops 502 through 508, a write decoder 510, a multiplexer 512, a read decoder 514, flip-flops 516 and 518, a multiplexer 520, and a flip-flop 522. Inputs (D) of the flip-flops 502 through 508 are configured to receive an input signal (IN). The input signal IN can be any one of the signals T1, T2, D1, and D2 described above. Clock ports of the flip-flops 502 through 508 are configured to receive the global clock BUFG. Output ports (Q) of the flip-flops 502 through 508 are coupled to respective inputs of the multiplexer 512. Clock enable (CE) ports of the flip-flops 502 through 508 are coupled to respective outputs of the write decoder 510.

A control input of the multiplexer 512 is coupled to an output of the read decoder 514. An output of the multiplexer 512 is coupled to an input of the multiplexer 520 and an input (D) of the flip-flop 516. An output (Q) of the flip-flop 516 is coupled to an input (D) of the flip-flop 518. Clock ports of the flip-flops 516 and 518 are configured to receive the clean clock BUFO. An output (Q) of the flip-flop 516 is also coupled to an input of the multiplexer 520. An output (Q) of the flip-flop 518 is coupled to another input of the multiplexer 520. A control input of the multiplexer 520 is configured to receive a control signal (C). An output of the multiplexer 520 is coupled to an input (Q) of the flip-flop 522. A clock port of the flip-flop 522 is configured to receive the clean clock BUFO. An output of the flip-flop 522 provides a signal OUT. The signal OUT can be coupled to the output 412 or the output 414, as shown in FIG. 4. The write decoder 510 is configured to receive an input signal (QW). The read decoder 514 is configured to receive an input signal (QR).

In operation, the input data IN is clocked into one or more of the flip-flops 502 through 508. The write decoder 510 controls which of the flip-flops 502 through 508 is enabled to receive the input data IN based on the input signal QW. The input signal QW is part of the signal ADDR generated by the address circuit 410. The multiplexer 512 selects an output (Q) of one of the flip-flops 502 through 508 under control of the read decoder 514 and the input signal QR, which is part of the signal ADDR generated by the address circuit 410. The multiplexer 520 selects the output of the multiplexer 512, the output of the flip-flop 516, or the output of the flip-flop 518 based on the control signal C. The control signal C can be part of the signal ADDR generated by the address circuit 410. The output signal OUT can be one of the output of the multiplexer 512, the output of the flip-flop 516, or the output of the flip-flop 518 based on the clean clock BUFO.

The flip-flops 502 through 508 provide a 2 clock separation between the data being clocked by BUFG and the data being clocked by the clean clock BUFO. The 2 clock separate allows the circuit 500 to perform write leveling and account for any jitter on the global clock BUFG. The input data IN is clocked into one or more of the flip-flops 502 through 504 by BUFG and the multiplexer 512 selects the data for the BUFO domain. The flip-flops 516, 518, and 522 provide parsing of the output. Since write leveling can require the output OUT to be delayed by almost one clock cycle, just adding delay to the clock BUFO is not sufficient to look like a corresponding delay on the output OUT. Adding delay to BUFO will change its relationship to BUFG. As BUFO is delayed (by the delay circuit 206), its relationship with BUFG will change, where adding additional delay will look to the output OUT as if delay was being subtracted. The flip-flops 516 and 518 can provide a buffer so that the output OUT always appears as though delay has been added to the BUFO regardless of the starting relationship between BUFO and BUFG.

Figure 6:
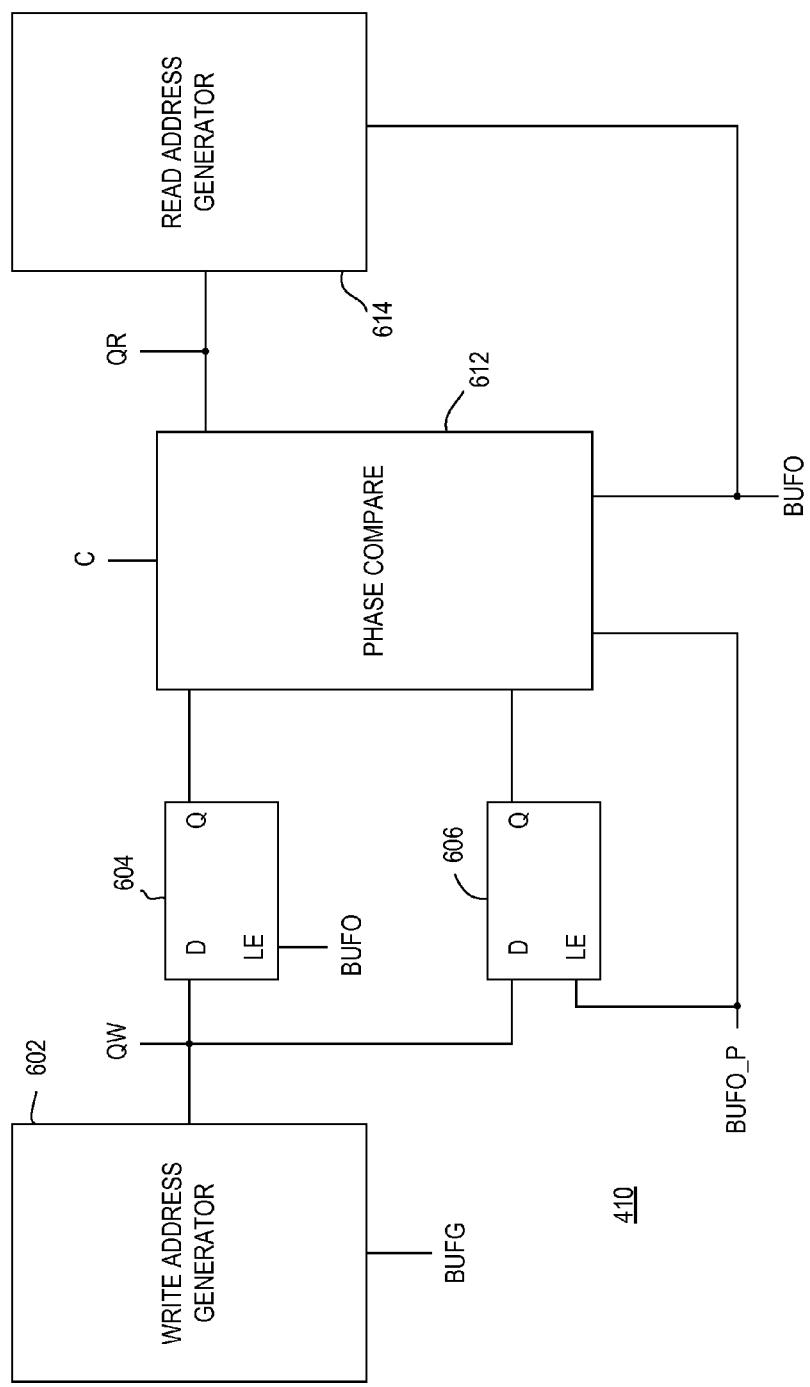
FIG. 6 is a block diagram depicting an embodiment of an address circuit.

FIG. 6 is a block diagram depicting an embodiment of the address circuit 410. The address circuit 410 can include a write address generator 602, latch circuits 604 and 606, a phase compare circuit 612, and a read address generator 614. The write address generator 602 generates the write address signal QW (as shown in FIG. 5) for each of the FIFOs 402 through 408 (part of the ADDR signal) according to the global clock BUFG. The write address signal QW is latched in the latch circuit 604 based on the clean clock BUFO, and latched in the latch circuit 606 based on the non-delayed clean clock BUFO_P. Outputs of the latch circuit 604 and 606 are coupled to inputs of the phase compare circuit 612.

The read address generator 614 generates the read address signals QR (as shown in FIG. 5) for each of the FIFOs 402 through 408 (part of the ADDR signal) according to the clean clock BUFO. The read address signal QR is coupled to an input of the phase compare circuit 612. Clock inputs of the phase compare circuit 612 are configured to receive the clean clock BUFO and the non-delayed clean clock BUFO_P. An output of the phase compare circuit 612 provides the control signal C that drives the multiplexer 520 (shown in FIG. 5).

In operation, the write address generator 602 generates a write addresses based on the global clock BUFG, and the read address generator 614 generates read addresses based on the clean clock BUFO. The write and read address generators 602 and 614 can be configured such that there is always at least one clock separation between BUFO and BUFG regardless of how much BUFO is skewed during write-leveling. The phase compare circuit 612 analyzes the skew between BUFG and BUFO_P. The phase compare circuit 612 determines whether the additional flip-flops 516 and/or 518 should be added to the data path through the output control signal C based on the detected skew.

Figure 7:
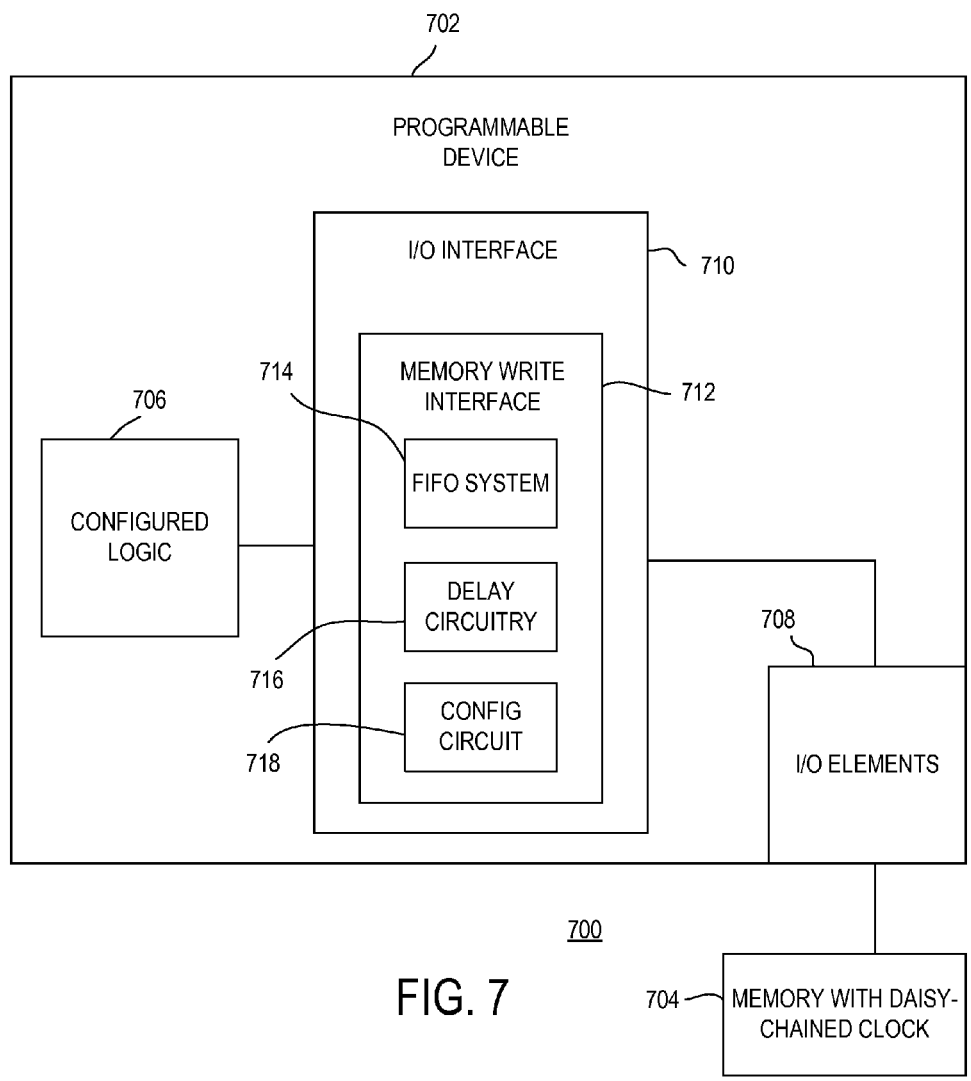
FIG. 7 is a block diagram depicting an exemplary embodiment of a programmable device system.

FIG. 7 is a block diagram depicting an exemplary embodiment of a programmable device system 700. The system 700 includes a programmable device 702 (e.g., having an architecture such as the FPGA 100) coupled to a memory 704. The memory 704 includes a daisy-chained clock (e.g., DDR3 or like type memory as noted above). The programmable device 702 includes configured logic 706, IO elements 708, and an IO interface 710. The configured logic 706 can be any type of logic that produces output data to be transmitted to the memory 702. The IO elements 708 are configured to couple the output data to the memory 702 (e.g., IOB elements). The IO interface 710 provides an interface between the configured logic 706 and the elements 708. The IO interface 710 includes a memory write interface 712. The memory write interface 712 can include one or more instances of the memory write interface 250 described above. Thus, the memory write interface 712 generally includes a FIFO system 714 having inputs for receiving the output data using a global clock of the programmable device 702, and outputs for providing the output data using a local clock generated only for the IO interface 710. The memory write interface 712 also includes delay circuitry 716 configured to add delay to the local clock with respect to the global clock, and a configuration circuit 718 configured to adjust the delay added to the local clock to implement write-leveling for the memory. As noted above, the local clock is delayed to implement write-leveling rather than the output data.

Figure 8:
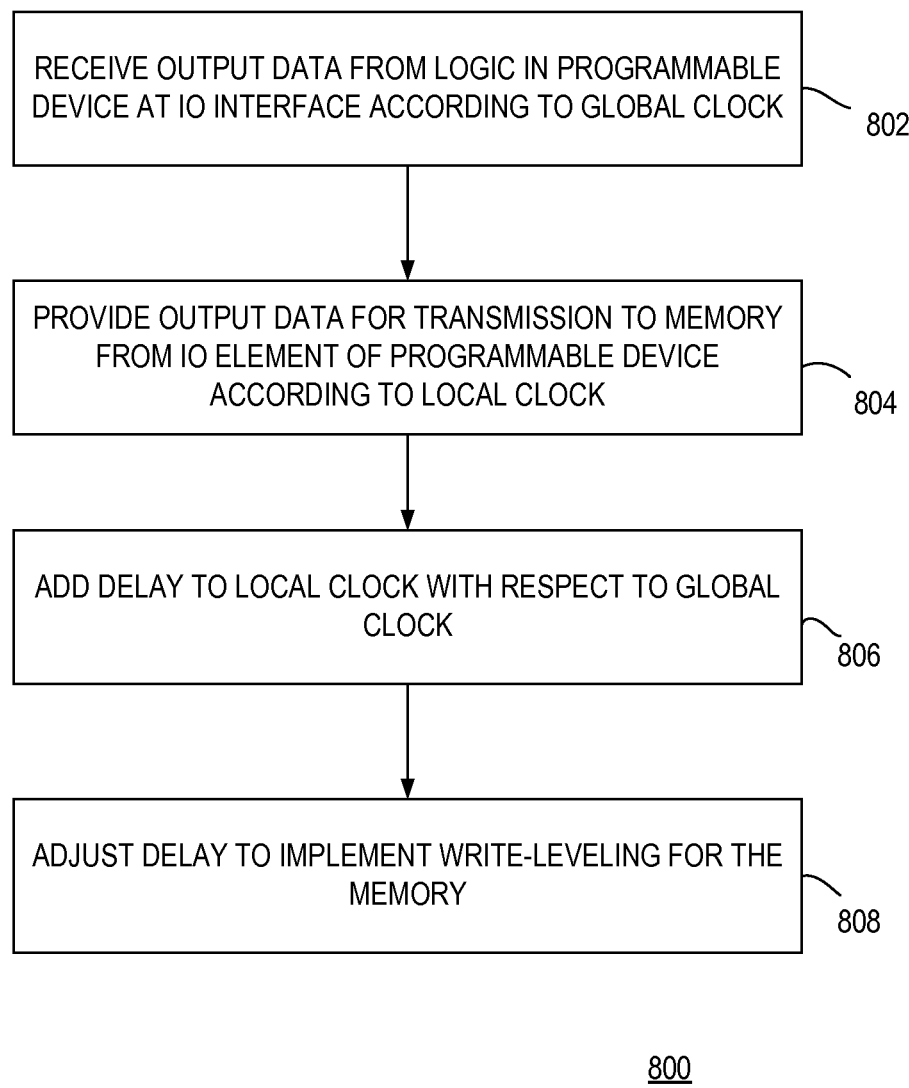
FIG. 8 is a flow diagram depicting an exemplary embodiment of a method of interfacing a programmable device and a memory with a daisy-chained clock.

FIG. 8 is a flow diagram depicting an exemplary embodiment of a method 800 of interfacing a programmable device and a memory with a daisy-chained clock. The method 800 can be performed by the IO circuit 200 described above. The method 800 begins at step 802, where output data is received from logic in the programmable device at an IO interface according to a global clock of the programmable device. At step 804, the output data is provided for transmission to the memory from an IO element of the programmable device according to a local clock used only by the IO interface. At step 806, a delay is added to the local clock with respect to the global clock. At step 808, the delay is adjusted to implement write-leveling at the memory. Notably, the steps 802 through 808 in the method 800 are not meant to convey a specific order, but occur contemporaneously. For example, while the output data is being received and provided for transmission, the local clock is being delayed, as noted in the device circuitry above.

In some embodiments, the IO element includes a three-state output driver, and the output data includes control data for controlling the three-state output driver. In some embodiments, the output data is received at a single-data-rate (SDR) and provided for transmission at a double-data-rate (DDR).

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

The invention claimed is:

1. An apparatus, comprising:
a memory write interface configured to drive a memory having a daisy-chained clock, a first interface configured to receive output data from a programmable device and a second interface configured to control transmission of the output data to the memory by an IO element, the first interface operating according to a global clock of the programmable device and the second interface operating according to a local clock used only by the apparatus;
a delay circuit configured to add a delay to the local clock with respect to the global clock; and
a configuration circuit configured to adjust the delay added to the local clock to implement write-leveling at the memory,
wherein the memory write interface comprises a first-in-first-out (FIFO) system that comprises a reset circuit configured to reset the FIFO system upon a transition from a receive mode to a transmit mode.

2. The apparatus of claim 1, wherein
the FIFO system has inputs for receiving the output data using the global clock, and outputs for providing the output data operative using the local clock.

3. The apparatus of claim 2, wherein the FIFO system comprises:
a plurality of FIFO circuits, each receiving one of the inputs of the FIFO system and providing one of the outputs of the FIFO system; and
an address circuit configured to generate an address signal for the plurality of FIFO circuits for storing and outputting the output data.

4. The apparatus of claim 3, wherein each of the plurality of FIFO circuits comprises:
a plurality of flip-flops configured to receive the output data operative using the global clock;
a write decoder configured to selectively enable one or more of the plurality of flip-flops;
a first multiplexer configured to select output from one of the plurality of flip-flops based on a first control signal; and
a read decoder configured to generate the first control signal.

5. The apparatus of claim 4, wherein each of the plurality of FIFO circuits further comprises:
first and second flip-flops coupled in series, the first and second flip-flops configured to store output of the first multiplexer according to the local clock;
a second multiplexer configured to select the output of the first multiplexer, output of the first flip-flop, or output of the second flip-flop based on a second control signal;
wherein the address circuit is configured to generate the second control signal.

6. The apparatus of claim 5, wherein each of the plurality of FIFO circuits further comprises:
a third flip-flop configured to store output of the second multiplexer according to the local clock.

7. The apparatus of claim 5, wherein the address circuit comprises:
a write address generator configured to generate write address data for storing the output data in the plurality of FIFO circuits according to the global clock;
latch circuits configured to store the write address data;
a read address generator configured to generate read address data for reading the output data from the plurality of FIFO circuits according to the local clock; and
a phase compare circuit, configured to receive the write address data from the latch circuits and the read address data from the read address generator, the phase compare circuit configured to determine skew between the global clock and the local clock and generate the second control signal based on the skew.

8. The apparatus of claim 3, wherein the FIFO system further comprises:
a delay control circuit configured to control the delay circuit to receive the local clock as input.

9. The apparatus of claim 1, wherein the IO element includes a three-state output driver, and wherein the output data includes control data for controlling the three-state output driver.

10. A method of interfacing a programmable device and a memory, the memory having a daisy-chained clock, the method comprising:
receiving output data from resources in the programmable device at an input/output (IO) circuit according to a global clock of the programmable device;
providing the output data for transmission to the memory from an IO element according to a local clock used only by the IO circuit;
adding a delay to the local clock with respect to the global clock;
adjusting the delay to implement write-leveling at the memory; and
resetting a first-in-first-out (FIFO) system upon a transition from a receive mode to a transmit mode.

11. The method of claim 10, wherein the IO element includes a three-state output driver, and wherein the output data includes control data for controlling the three-state output driver.

12. The method of claim 10, wherein the output data is received at a single data rate (SDR) and the output data is provided at a double data rate (DDR).

13. The method of claim 10, wherein the step of receiving the output data comprises storing the output data in the FIFO system according to the global clock, and wherein the step of providing comprises reading the output data from the FIFO system according to the local clock.

14. The method of claim 10, further comprising:
determining a skew between the global clock and the local clock;
delaying the output data in the FIFO system based on the skew.

15. The method of claim 14, wherein the step of delaying the output data comprises:

passing the output data through one or more flip-flops before being read from the FIFO system based on the skew.

16. The method of claim 10, wherein the step of adjusting the delay comprises:
programming configuration memory of the programmable device such that a delay circuit that delays the local clock is configured with the delay.

17. A programmable device coupled to a memory having a daisy-chained clock, comprising:
configured resources for generating output data to be transmitted to the memory;
input/output (IO) elements for coupling the output data to the memory; and
an IO circuit between the configured resources and the IO elements, the IO circuit including a memory write interface for driving the memory, the memory write interface including:
a first-in-first-out (FIFO) system having inputs for receiving the output data using a global clock of the programmable device and outputs for providing the output data using a local clock, the local clock being used only by IO circuit;
delay circuitry configured to add delay to the local clock with respect to the global clock;
a configuration circuit configured to adjust the delay added to the local clock to implement write-leveling; and
a reset circuit configured to reset the FIFO system upon a transition from a receive mode to a transmit mode.

18. The programmable device of claim 17, wherein the FIFO system comprises:
a plurality of FIFO circuits, each receiving one of the inputs of the FIFO system and providing one of the outputs of the FIFO system; and
an address circuit configured to generate an address signal for the plurality of FIFO circuits for storing and outputting the output data.

19. The programmable device of claim 18, wherein each of the plurality of FIFO circuits comprises:
a plurality of flip-flops configured to receive the output data operative using the global clock;
a write decoder configured to selectively enable one or more of the plurality of flip-flops;
a first multiplexer configured to select output from one of the plurality of flip-flops based on a first control signal;
a read decoder configured to generate the first control signal;
first and second flip-flops coupled in series, the first and second flip-flops configured to store output of the first multiplexer according to the local clock; and
a second multiplexer configured to select the output of the first multiplexer, output of the first flip-flop, or output of the second flip-flop based on a second control signal;
wherein the address circuit is configured to generate the second control signal.

20. The apparatus of claim 7, wherein there is at least one clock separation between the local clock and the global clock.

* * * * *